United States Patent [19]
Kennedy et al.

[11] Patent Number: 5,384,551
[45] Date of Patent: Jan. 24, 1995

[54] FAST LOCKING PHASE LOCKED LOOP FREQUENCY SYNTHESIZER

[75] Inventors: Richard A. Kennedy; Richard A. Summe, both of Kokomo, Ind.; John R. Pacourek, Oak Creek, Wis.

[73] Assignee: Delco Electronics Corporation, Kokomo, Ind.

[21] Appl. No.: 23,795

[22] Filed: Feb. 25, 1993

[51] Int. Cl.⁶ .............. H03L 7/089; H03L 7/093; H03L 7/107; H03L 7/18
[52] U.S. Cl. .............................. 331/17; 331/1 A; 331/18; 331/25; 455/260
[58] Field of Search ............. 331/16, 17, DIG. 2, 331/1 A, 10, 14, 18, 25; 455/76, 123, 260

[56] References Cited

U.S. PATENT DOCUMENTS

| | | | |
|---|---|---|---|
| 3,643,168 | 2/1972 | Manicki | 325/459 |
| 3,768,018 | 10/1973 | Deming | 325/67 |
| 3,953,800 | 4/1976 | Nakamura et al. | 325/455 |
| 4,232,398 | 11/1980 | Gould et al. | 455/226 |
| 4,334,323 | 6/1982 | Moore | 455/179 |
| 4,377,728 | 3/1983 | Hilbert | 179/1 |
| 4,987,387 | 1/1991 | Kennedy et al. | 331/1 A |
| 5,014,316 | 5/1991 | Marrah et al. | 381/15 |
| 5,166,644 | 11/1992 | Saito et al. | 331/16 X |
| 5,180,993 | 1/1993 | Dent | 331/16 |
| 5,194,828 | 3/1993 | Kato et al. | 331/DIG. 2 |
| 5,220,294 | 6/1993 | Ichikawa | 331/16 X |

*Primary Examiner*—David Mis
*Attorney, Agent, or Firm*—Anthony L. Simon; Jimmy L. Funke

[57] ABSTRACT

A radio apparatus with a phase locked loop is disclosed. The apparatus contains a phase detector with first and second inputs, where the first input receiving a reference frequency signal and the second input receives a controllable frequency signal that is controlled by a tuning voltage. Also included is, a loop filter for filtering the output of the phase detector, circuitry for decoding when a phase difference at the inputs of the phase detector exceeds a predetermined value, and a filter bypass circuit. This circuit bypasses operation of the loop filter when the difference at the inputs of the phase detector exceeds a predetermined value, allowing fast voltage changes of the tuning voltage, and providing a short lock time for the phase locked loop.

3 Claims, 9 Drawing Sheets

PRIOR ART

FAST LOCKING PHASE LOCKED LOOP FREQUENCY SYNTHESIZER

The subject of this specification relates to the subject of copending U.S. patent applications, Ser. Nos. 07/952,554, filed Sep. 28, 1992, and 07/954,997, filed Oct. 1, 1992, both assigned to the assignee of this invention and both having disclosures that are incorporated herein by reference.

This invention relates to an improved phase locked loop useful in electronically tuned radios.

BACKGROUND OF THE INVENTION

Figure 1:
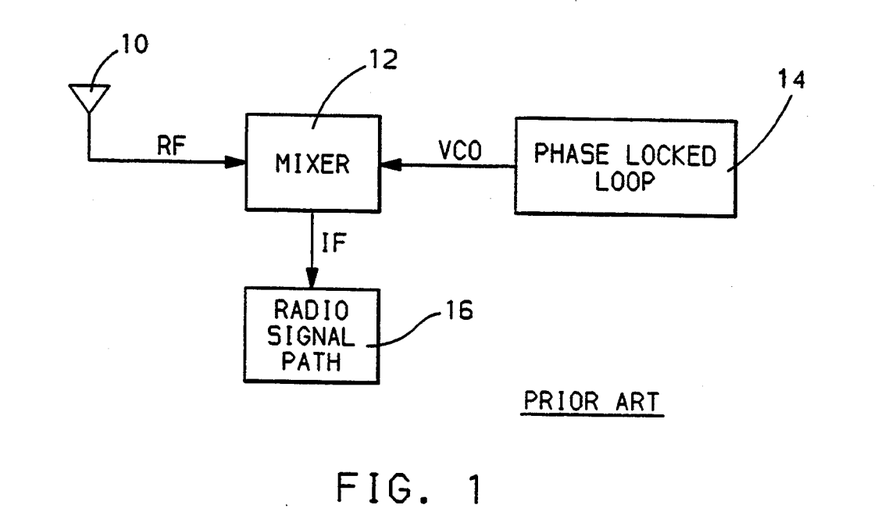
FIGS. 1-5 illustrate the above-described prior art.

One application of a Phase Locked Loop (PLL) circuit is in a frequency synthesizer that controls the local oscillator frequency in the front end of an electronically tuned receiver. In this application, the phase locked loop generates the required frequency to mix with the RF energy from the antenna such that the user selected carrier frequency (IF) can be isolated from other signals and detected. Prior Art FIG. 1 shows a phase locked loop in this application, illustrating antenna 10, mixer 12, phaselocked loop 14 and the remainder of the radio signal processing and audio circuitry 16. For optimal receiver performance it is necessary that the resulting local oscillator have the maximum possible spectral purity.

An example of a prior art phase locked loop with desirable performance characteristics is shown in U.S. Pat. No. 4,987,387, Kennedy et al., assigned to the assignee of this invention and having a disclosure that is incorporated herein by reference.

Figure 2:
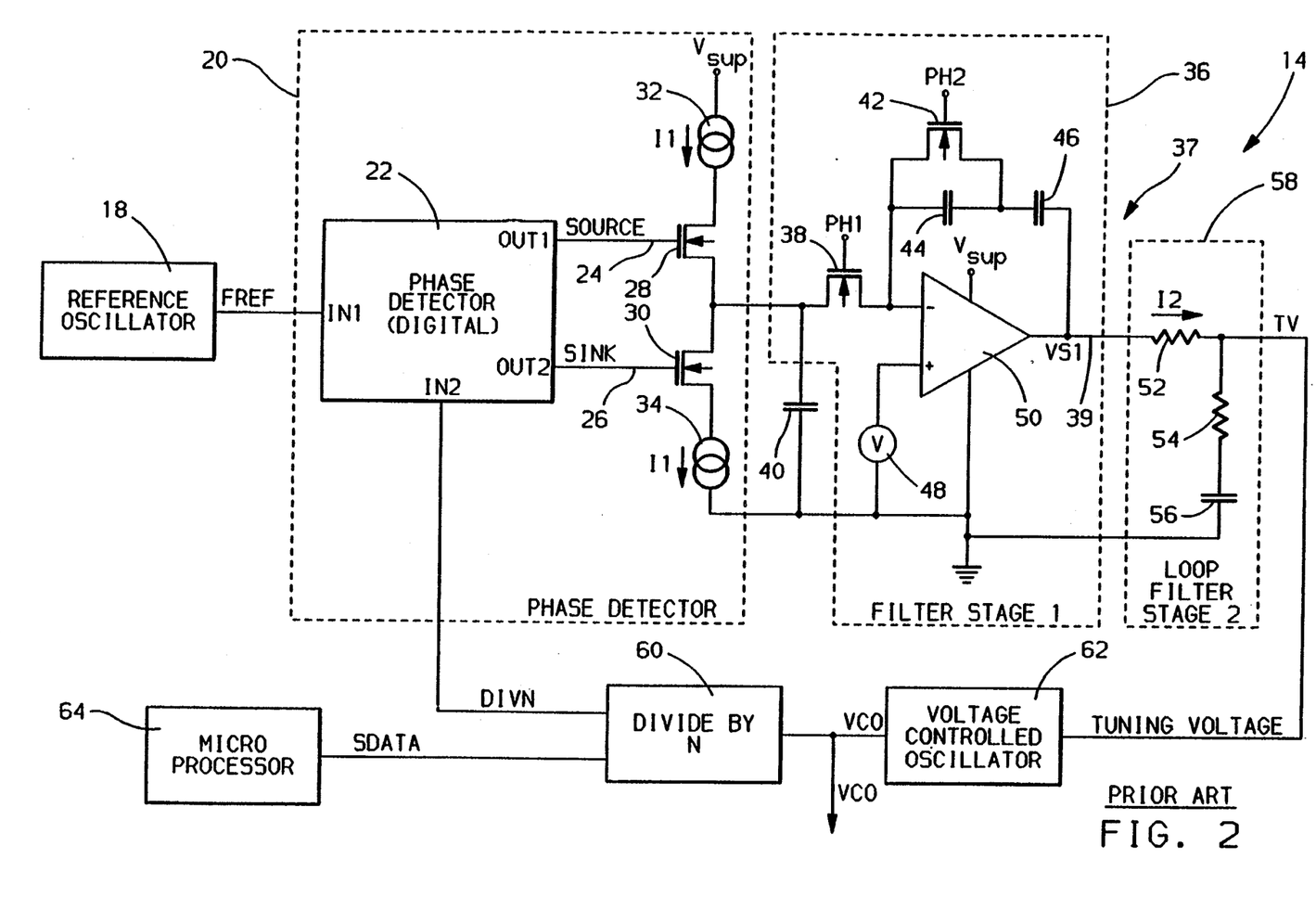

Referring to the FIG. 2, the phase locked loop 14 includes a phase detector (PD) 22, a voltage controlled oscillator (VCO) 62, a reference oscillator 18, a divide by N counter 60, a loop filter (LF) 37 consisting of two stages 36, 58, and a microprocessor 64 for control. The output FREF of reference oscillator 18 is connected to one input of the phase detector 22 to produce the phase comparison frequency. The output signal DIVN of divide by N counter 60 is connected to the other input of phase detector 22. Phase detector 22 compares the phase of the reference frequency FREF and the frequency signal DIVN and produces an output that is proportional to the phase difference between the two signals.

Figure 3:
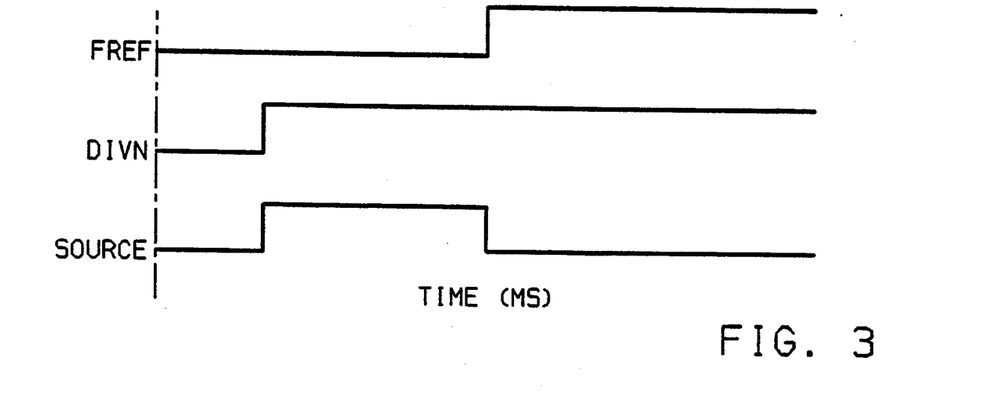

FIGS. 3, 4 and 5 illustrate the operation of the phase detector 22. The rising edge of signal FREF is considered the reference. Referring to a first case scenario in FIG. 3, when the rising edge of DIVN occurs before the rising edge of FREF, the signal SOURCE on line 24 (FIG. 2) goes high, enabling transmission gate 28. As a result, current from current source 32 flows into capacitor 40. The current flow into capacitor 40 causes the voltage Vc40 across capacitor 40 to increase. The amount of voltage created on capacitor 40 is proportional to the phase difference between the inputs FREF and DIVN of phase detector 22.

Figure 4:
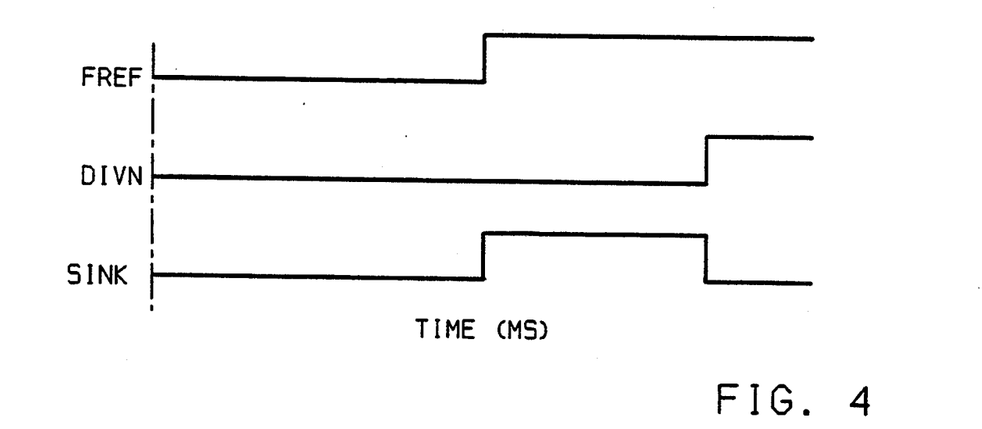

Referring to a second case scenario in FIG. 4, when the rising edge of FREF occurs before the rising edge of DIVN, the signal SINK on line 26 goes high, enabling transmission gate 30. As a result, current from current source 34 flows out of capacitor 40. The current flow into capacitor 40 causes the voltage Vc40 across capacitor 40 to decrease. The voltage on capacitor 40 is proportional to the phase difference between the inputs FREF and DIVN of phase detector 22.

Figure 5:
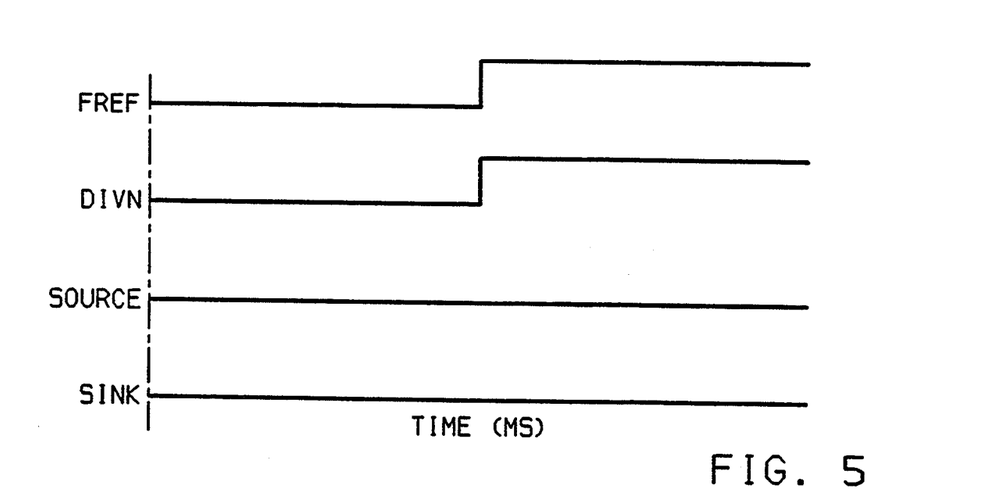

Referring to a third case scenario in FIG. 5, when the rising edges of FREF and DIVN occur at the same time, there are no SOURCE or SINK pulses and therefore no current flows into or out of capacitor 40. This is the phase locked condition. Phase locked loop 14 operates to obtain the phase locked condition of FIG. 5.

The voltage Vc40 across capacitor 40 is filtered by the switched capacitor loop filter 36 (the first filter stage), comprising amplifier 50, capacitors 44 and 46, transmission gates 38 and 42, and reference voltage generator 48. First filter stage 36 has a pole at 0 Hz, and a higher frequency zero to provide very high gain at dc and unity gain above the zero frequency, essentially acting as an integrator with a zero added to provide stability to the loop and functioning to add up the phase differences of each clock cycle. If the phase of DIVN is far away from the phase of FREF, the output of the loop filter 36 will keep increasing or decreasing until the phase and frequencies become the same.

The voltage (Vs1) on line 39 at the output of first stage 36 is then applied to the second stage 58 of loop filter 37. Second stage 58 comprises resistors 52 and 54 and capacitor 56 and attenuates noise by the ratio $(R52+R54)/R54$ at frequencies above the zero frequency. The desired signal is also attenuated above the zero frequency. However since the desired steady state signal is a dc voltage, it does not adversely effect the operation of the loop. It is important to note for later reference that the current I2 flowing into capacitor 56 is equal to:

$$(Vs1 - Vc56)/(R52 + R54). \tag{1}$$

The output signal TV of the second stage 58 is the tuning voltage control signal that controls the frequency of voltage controlled oscillator 62. The output signal VCO of voltage controlled oscillator 62 is connected to the input of divide by N counter 60. The signal output from divide by N counter 60 has a frequency equal to 1/N times the frequency of the signal VCO. The signal TV forces the frequency of the signal VCO to change in the correct direction until the phase and the frequency of the signals DIVN and FREF are the same. This completes the control loop.

The function of microprocessor 64 is to send the correct divide by N number to divide by N counter 60 for mixing the frequency signal VCO with the RF energy. Details required to implement the above described circuits are known to those skilled in the art.

In implementing a phase locked loop such as the one shown, it is desirable to maintain high loop gain and low noise both of which are very desirable. The characteristics give rise to slew rate limitations, resulting in a relatively long time period (i.e., approximately 40 ms) required to acquire lock when the FREF frequency is far away from the DIVN frequency.

The relatively long lock time is created by the charge rate of capacitor 56, defined as:

$$dVc56/dt = (Vs1 - Vc56)/((R52+R54)*C56)). \tag{2}$$

The Tuning Voltage (TV) is equal to:

$$((Vs1 - Vc56)*R54/(R52+R54) + Vc56). \tag{3}$$

Long locking time slows radio response time since the radio cannot isolate and detect the user selected carrier frequency until the phase locked loop has acquired lock.

In using on-chip implementations for the above system, the switching capacitor filter is integrated and an external lead-lag network is used. During the larger excursions that occur during channel changes, the on chip op amp very quickly hits the power supply rails due to it's high gain. When this happens the relatively long time constant of the external lead-lag network becomes the limiting factor and it can take a relatively long time to achieve lock.

A new radio format known as RDS (Radio Data System) has software capable of selecting the best available station from a list of stations carrying the same program material. Doing this requires fast frequency hopping to look at each station in the list.

SUMMARY OF THE INVENTION

Advantageously, this invention provides a frequency synthesizer with very fast lock capability (i.e., on the order of 5 ms). Advantageously, the method and apparatus of this invention retain a phase locked loop with the high gain and low noise features described above while including additional circuitry to eliminate the slew rate limitations inherent in typical prior art systems.

Advantageously, this invention operates to decode when the phase difference at the inputs of the phase locked loop's phase detector exceeds a predetermined value. When this occurs, the loop filter is bypassed allowing fast voltage changes of the tuning voltage, providing the tuning voltage with a fast slew rate. This fast slewing tuning voltage TV forces the voltage controlled oscillator frequency to move rapidly toward the new frequency creating a much shorter lock time for the phase locked loop. When the phase difference pulls in below the predetermined value, the filter is no longer bypassed, and the phase locked loop operates as before with high dc gain and low noise.

Advantageously according to this invention, when the phase locked loop is disturbed out of a phase locked condition such that the phase difference between the signals DIVN and FREF exceeds a predetermined threshold defining a phase window, additional circuitry (a secondary loop) is activated that bypasses the loop filter and drive the tuning voltage capacitor directly with a very large current. The large current can be chosen for a fast locking time. When the phase difference is back within the phase window, this bypass circuitry is shut off and the phase locked loop operates with low noise and high dc gain provided by the loop filter. This allows the voltage controlled oscillator to pull into phase lock at a rate much greater than the primary loop can achieve by itself. This invention thus advantageously allows the primary loop to be designed for optimal performance in the phase locked condition while also providing fast slewing capability when a new channel is selected.

Advantageously, the method of this invention includes the steps of detecting a phase difference between a reference signal and a divide by N signal (the controllable signal), comparing the phase difference to a predetermined threshold, processing the phase difference through a filter path to develop a tuning voltage if the phase difference is less than the predetermined threshold, and otherwise processing the phase difference through a bypass path to develop the tuning voltage.

DETAILED DESCRIPTION OF THE INVENTION

Figures 6, 8:
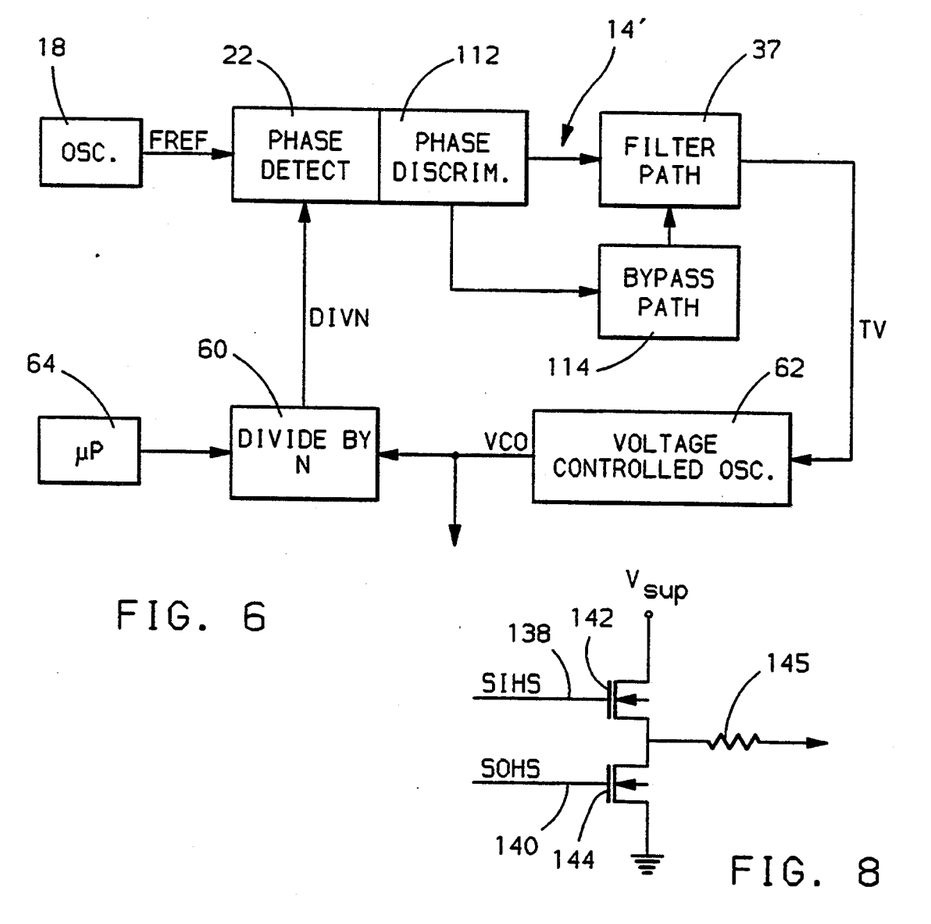
FIG. 6 comprises a schematic of the apparatus and method of this invention.
FIG. 8 illustrates an alternative implementation of this invention.

Referring to FIG. 6, the method and apparatus of this invention depicted by the schematic illustration includes oscillator 18, phase detector 22, loop filter (filter path) 37, voltage controlled oscillator 62, divide by N counter 60 and microprocessor 64 all operating identical to the above described prior art. According to this invention phase discriminator 112 and bypass path 114 are included.

Phase discriminator 112 performs the step of comparing the phase difference between the signals DIVN and FREF to a predetermined threshold value. If the phase difference between the signals DIVN and FREF is less than the predetermined threshold value, the phase difference is processed through filter path 37. Filter path 37 performs the processing operations of loop filter 37 shown in FIG. 2 and varies the tuning voltage signal TV at a speed determined by a first time constant represented by equation (2) above.

If the phase difference between the signals DIVN and FREF is greater than the predetermined threshold value, the phase difference is processed through bypass path 114 (also referred to as the alternative path). Bypass path 114 performs a processing operation that varies the tuning voltage signal TV at a speed determined by a second time constant, which is smaller than the first time constant to allow faster locking time of the phase locked loop 14' shown.

During radio operation, a large phase difference between the signals FREF and DIVN may occur during either (1) station channel changing commanded by the operator in manual, seek, scan, or preset modes, or (2) during station searching in connection with RDS operation. When the large phase difference between FREF and DIVN is detected, the utilization of bypass path 114 provides faster lock-acquiring operation of the phase locked loop 14'. When the phase difference between FREF and DIVN is brought below the predetermined threshold level, filter path 37 is provided, and the phase locked loop 14' operates according to the system described with respect to FIG. 2.

Figure 7:
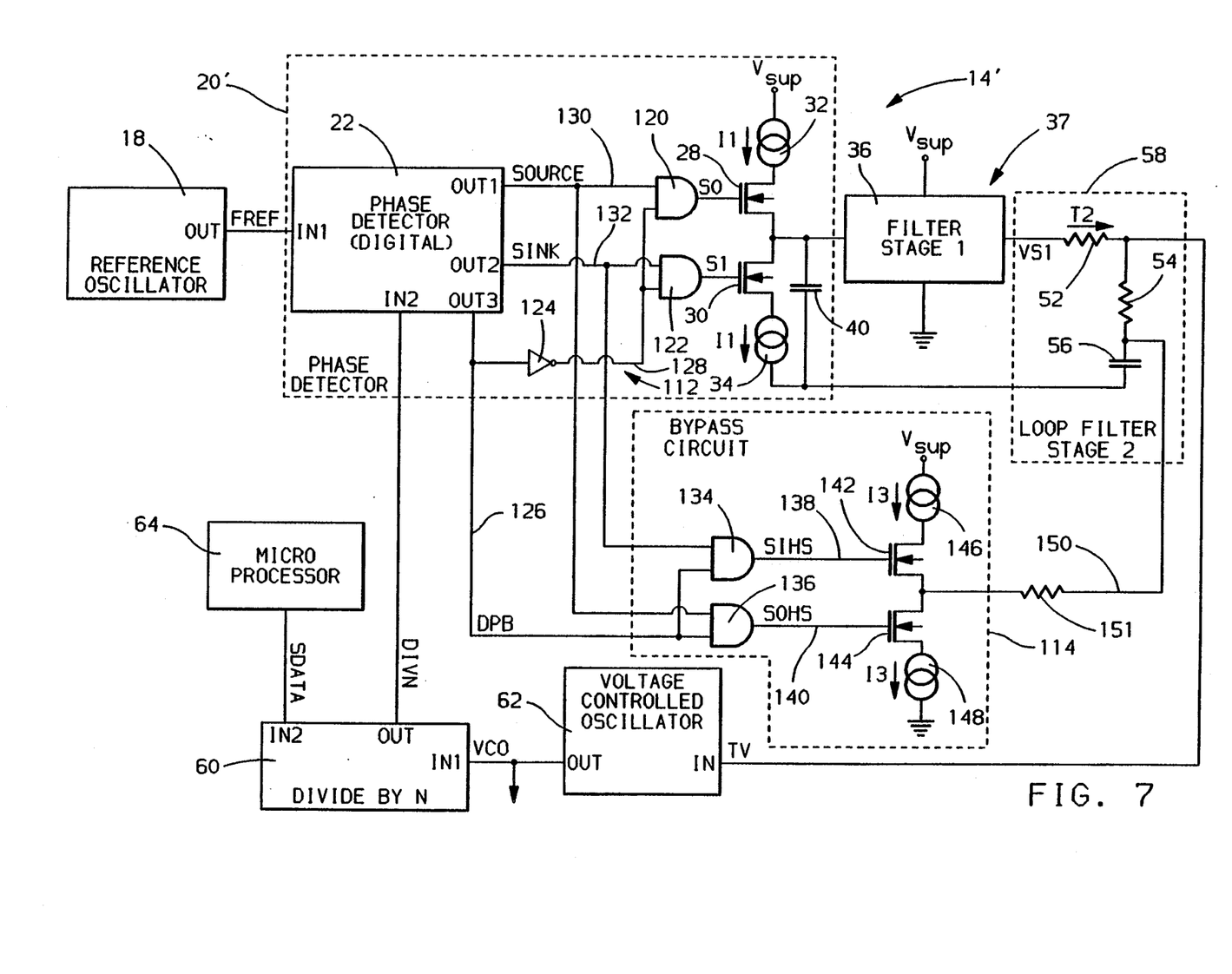
FIG. 7 illustrates a detailed implementation of this invention.

Referring to FIG. 7, circuitry incorporated into the phase locked loop according to this invention includes signal line 126, NOT gate 124 and AND gates 120 and 122, which together comprise the phase discriminator 112. Bypass path 114 comprises AND gates 134 and 136, transmission gates 142 and 144 and current sources 146 and 148. Current source 146 is connected in series with transmission gate 142, which is connected to transmission gate 144 in series with current source 148. Transmission gates 142 and 144 are controlled by the outputs of AND gates 134 and 136 to provide a current path to capacitor 56 (via resistor 156) to selectively charge and discharge capacitor 56 with current I3 provided by current sources 142,144.

As in the prior art, reference oscillator 18 and divide by N counter 60 are connected to phase detector 22. The phase detector compares the phase difference of the Reference frequency (FREF) and the divide by N counter frequency (DIVN) and produces an output that is proportional to the phase difference between the two signals via lines 130 (SOURCE), 132 (SINK) and 126 (DPB). Output line 126, while present in the prior art (refer to the above mentioned U.S. Pat. No. 4,987,387, signal PH1, shown in FIGS. 1, 3, 4 and 5), is used in the present invention to define a phase difference window. When the phase difference is within the window, filter path 37 is used, when the phase difference is outside the window, bypass path 114 is used.

Reference to the timing diagrams of FIGS. 9–13 along with FIG. 7 are helpful in understanding the operation of the phase detector 22 and phase discriminator 112. Note: all events are referenced to the rising edge of FREF.

FIGS. 9–13 illustrate five different modes of operation. First, referring to FIG. 9, assume that the loop is in the phase locked condition. The phase and frequency of FREF and DIVN are equal and DIVN is equal to the voltage controlled oscillator frequency divided by the number N. Notice that rising edges of DIVN and FREF occur at the same point in time. There is zero phase difference between the two signals.

Figure 9:
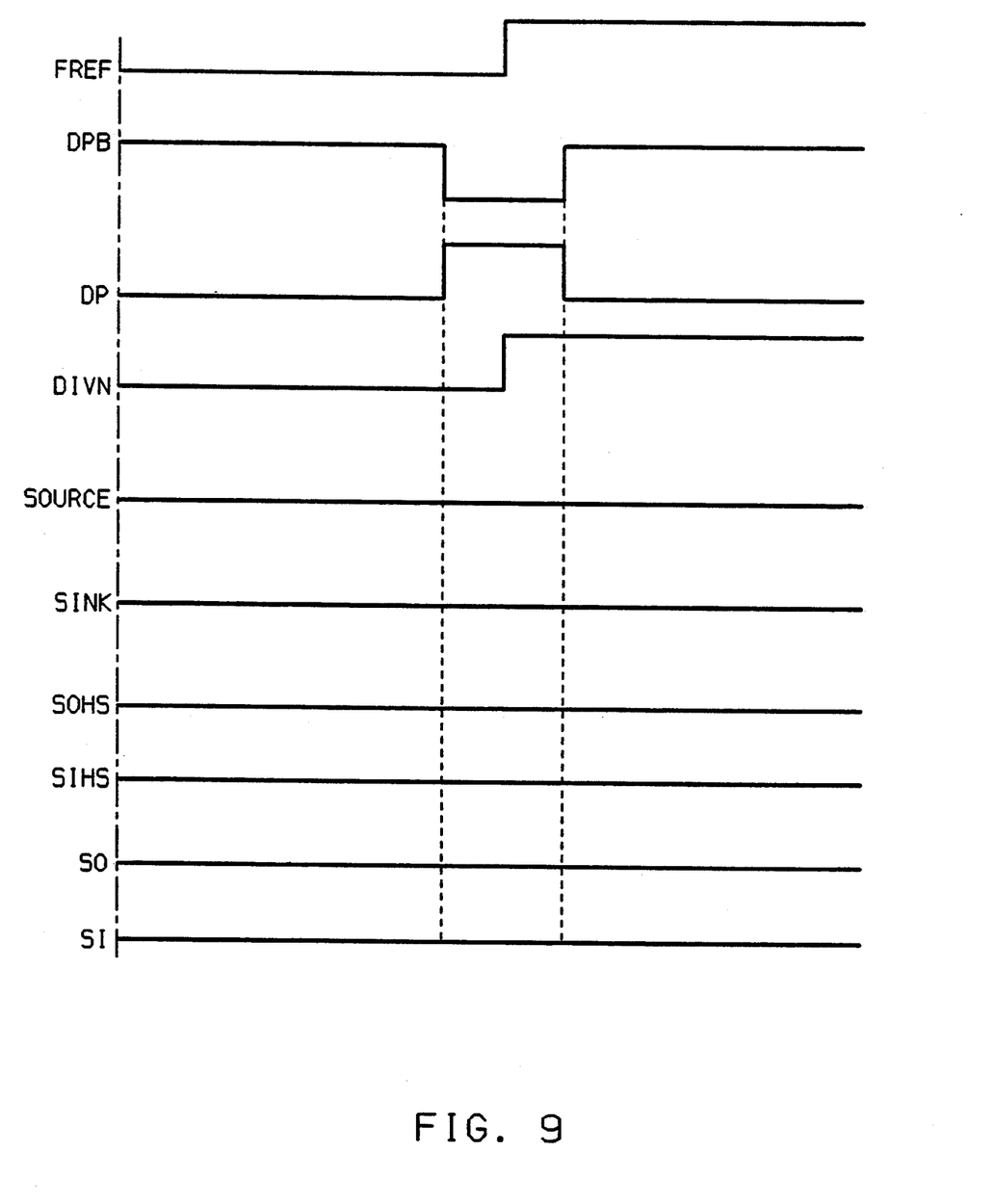
FIGS. 9-13 are timing diagrams illustrating the operation of the method and apparatus of this invention.

Now assume that microprocessor 64 sends a new divide by N number to the divide by N counter 60. The output of the divide by N counter (DIVN) immediately jumps to a new frequency that does not equal FREF because the divide by N counter is now dividing by a new number. At this instant, the DIVN frequency and phase do not equal the frequency and phase of FREF. Now the phase locked loop 14' has been disturbed out of the phase locked condition and will react to acquire lock again.

When a new N number is latched into the divide by N counter 60, the output frequency of voltage controlled oscillator 62 must change to acquire phase lock because the reference frequency does not change. A new N number implies a new voltage controlled oscillator frequency in the phase locked condition, which in turn means that the tuning voltage TV, which controls the frequency of the voltage controlled oscillator 62, must also move to a new voltage. The speed at which the phase locked loop reacts to adjust the voltage controlled oscillator to the new frequency (expressed in the above equation) is called the locking time.

Figure 10:
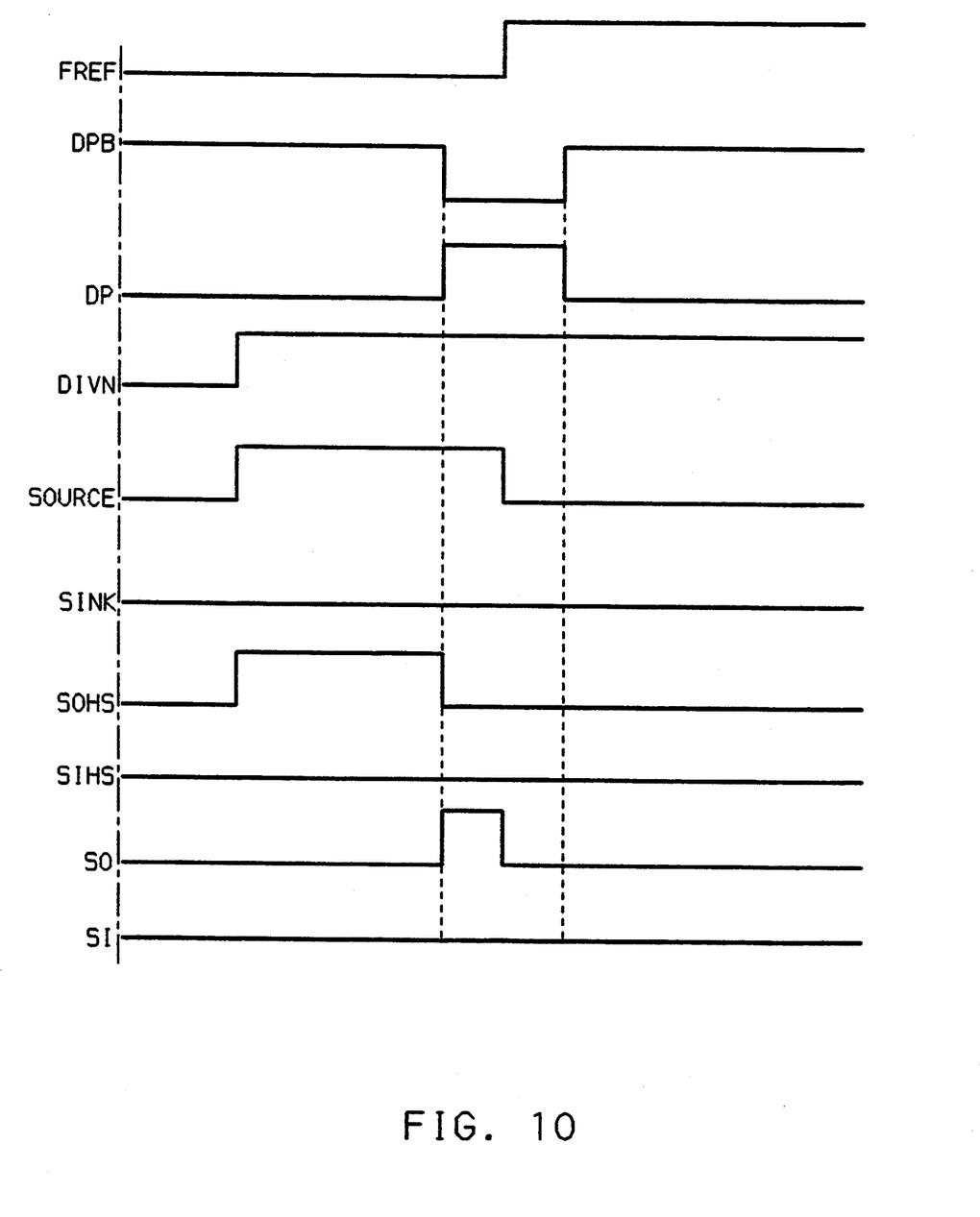

Referring to FIG. 10, the rising edge of DIVN occurs before the rising edge of FREF and outside of the phase window defined by the signal DP on line 128, which is the inverse of the signal DPB on line 126. Line 130, carrying the signal SOURCE goes high with the rising edge of DIVN and stays high until the rising edge of FREF. The signal SOURCE is derived in the digital section of the phase detector along with the signals DP and DPB in a manner well known to those skilled in the art.

According to this invention, the signal on line 140, SOHS, the logical AND of SOURCE and DPB at AND gate 136, goes high with the rising edge of SOURCE and stays high until the falling edge of DPB on line 126. During the time that SOHS is high, transmission gate 144 is on and current I3 from current source 148 flows out of capacitor 56 through transmission gate 144 to the circuit ground. This causes the voltage Vc56 on capacitor 56 to decrease.

The rate of change of the voltage Vc56 on capacitor 56 is proportional to the difference in phase between the rising edge of DIVN and the falling edge of DPB. The tuning voltage TV is as defined in equation (3) above. Signal DP and AND gates 120 and 122 prevent voltage Vs1 from changing at this time. Since Vc56 is decreasing and Vs1 is constant, the signal TV decreases. The decrease in TV causes the frequency of signal VCO output from voltage controlled oscillator 62 to decrease, which causes the frequency of DIVN to decrease at a rate N times slower than the decrease of the frequency of signal VCO.

When the falling edge of DPB occurs, the signal SOHS output from AND gate 136 falls. At this point transmission gate 144 shuts off and current I3 stops flowing out of capacitor 56. At the same time, signal DP goes high. This causes the signal SO, output from AND gate 120 and comprising the logical AND of SOURCE (which is still high) and DP, to go high. The high state of signal SO causes transmission gate 28 to turn on, in turn causing current I1 from current source 32 to flow from the voltage supply rail through gate 28 and into capacitor 40. Responsively, the voltage across capacitor 40 increases.

As the rising edge of FREF occurs, the signal SOURCE falls due to decoding circuitry (well known to those skilled in the art) in the digital section of the phase detector, causing signal SO to go low at the output of AND gate 120. Transmission gate 28 responsively shuts off and current I1 stops flowing into capacitor 40.

During the time that transmission gate 28 is on, the rate of change of voltage Vc40 is I1/C40. Therefore, the change in voltage Vc40 across capacitor 40 is proportional to the difference in phase between the rising edges of DP and FREF.

The capacitor voltage Vc40 is applied to the loop filter first stage 36, which operates as an inverting integrator, providing the high dc gain. The output voltage Vs1 of first stage 36 is then applied to the loop filter second stage 58. The capacitor voltage Vc56 decreases because the voltage Vs1 is less than the voltage Vc56 and current I2 flows out of capacitor 56. During this state, the rate of change of the capacitor voltage Vc56 is I2/C56, where I2 is equal to (Vs1−Vc56)/(R52+R54). The tuning voltage TV as defined by equation (3) above starts decreasing. The decrease in TV causes the voltage controlled oscillator frequency to decrease, in turn causing the frequency of DIVN to decrease at a rate N times slower.

It is important to note here that the current I3 (above) is flowing out of capacitor 56 only during the time interval when SOHS is high. However, current I2 will stop flowing out of capacitor 56 only when voltage Vs1 is equal to voltage Vc56. The current I3 can be chosen to be much larger than I1. Therefore, when the transmission gates 142 or 144 are on, the rate of change of TV can be very large.

Figure 11:
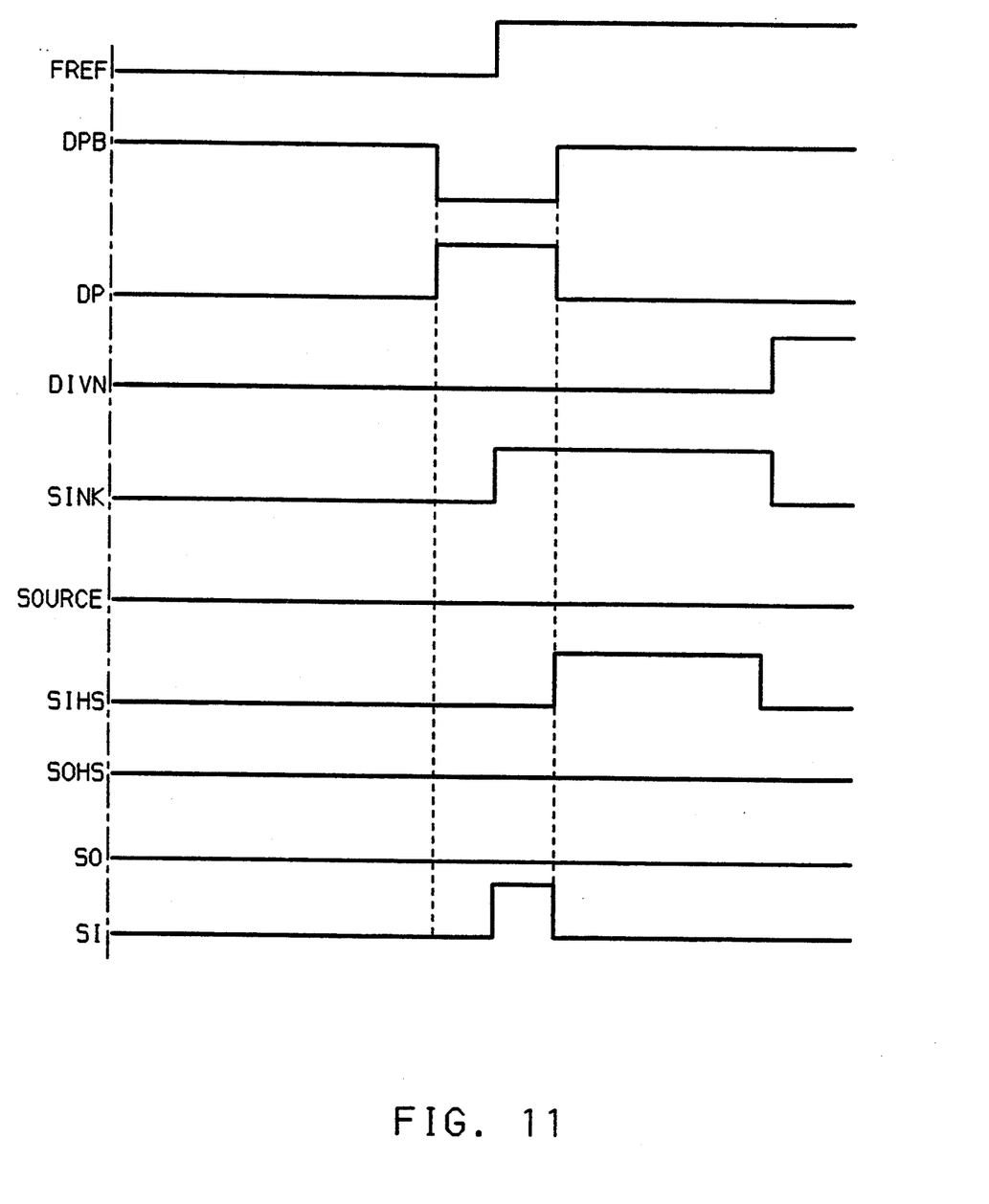

In another example mode of operation, refer to FIG. 11. The rising edge of DIVN occurs after the rising edge of FREF and outside of the DPB phase window. The signal on line 132, SINK, goes high with the rising edge of FREF and stays high until the rising edge of DIVN. The signal SINK is derived in the digital section of the phase detector along with the signals DP and DPB in a manner well known to those skilled in the art. While SINK and DP are high, the signal SI, output from AND gate 122, is high.

The high state of signal SI causes transmission gate 30 to turn on and causes current I1 to flow out of capacitor 40 through gate 30 to circuit ground. This causes voltage Vc40 across capacitor 40 to decrease at a rate of change defined by I1/C40. At the occurrence of the falling edge of the signal DP, the signal SI falls low, shutting off transmission gate 30 and terminating the flow of current I1 out of capacitor 40.

The above change in voltage Vc40 on capacitor 40 is proportional to the difference in phase between the rising edge of SI and falling edge of DP. The voltage level across capacitor 40 is filtered through filter stages 36 and 58. Responsively, the voltage across capacitor 56 increases because the voltage Vs1 is greater than Vc56, causing current I2 to flow into capacitor 56. In this state, the rate of change of the capacitor voltage Vc56 is I2/C56 where I2 is equal to (Vs1−Vc56)/(R52+R54).

The tuning voltage TV is as defined in Equation (3) and also responsively increases. The increase in the tuning voltage TV causes the frequency of signal DIVN to increase at a rate N times slower than the resultant increase in the frequency of the signal VCO.

The rising edge of signal DPB occurs at the falling edge of the signal DP, causing the signal SIHS output from AND gate 134 to rise and stay high until the falling edge of the signal SINK on line 132. The falling edge of SINK is triggered by the rising edge of DIVN. During the time that SIHS is high, transmission gate 142 is on and current I3 flows into capacitor 56 from the voltage supply rail through gate 142. As a result, the voltage on capacitor 56 increases at a rate of change equal to I3/C56, with the overall change in voltage Vc56 on capacitor 56 proportional to the difference in phase between the rising edge of DPB and the rising edge of DIVN.

The tuning voltage TV is as described in Equation (3), and since voltage Vs1 does not change in this state, the tuning voltage increases, causing the frequency of the signal VCO to increase, and thereby causing the frequency of the signal DIVN to increase at a rate N times slower than the increase in VCO.

Figure 12:
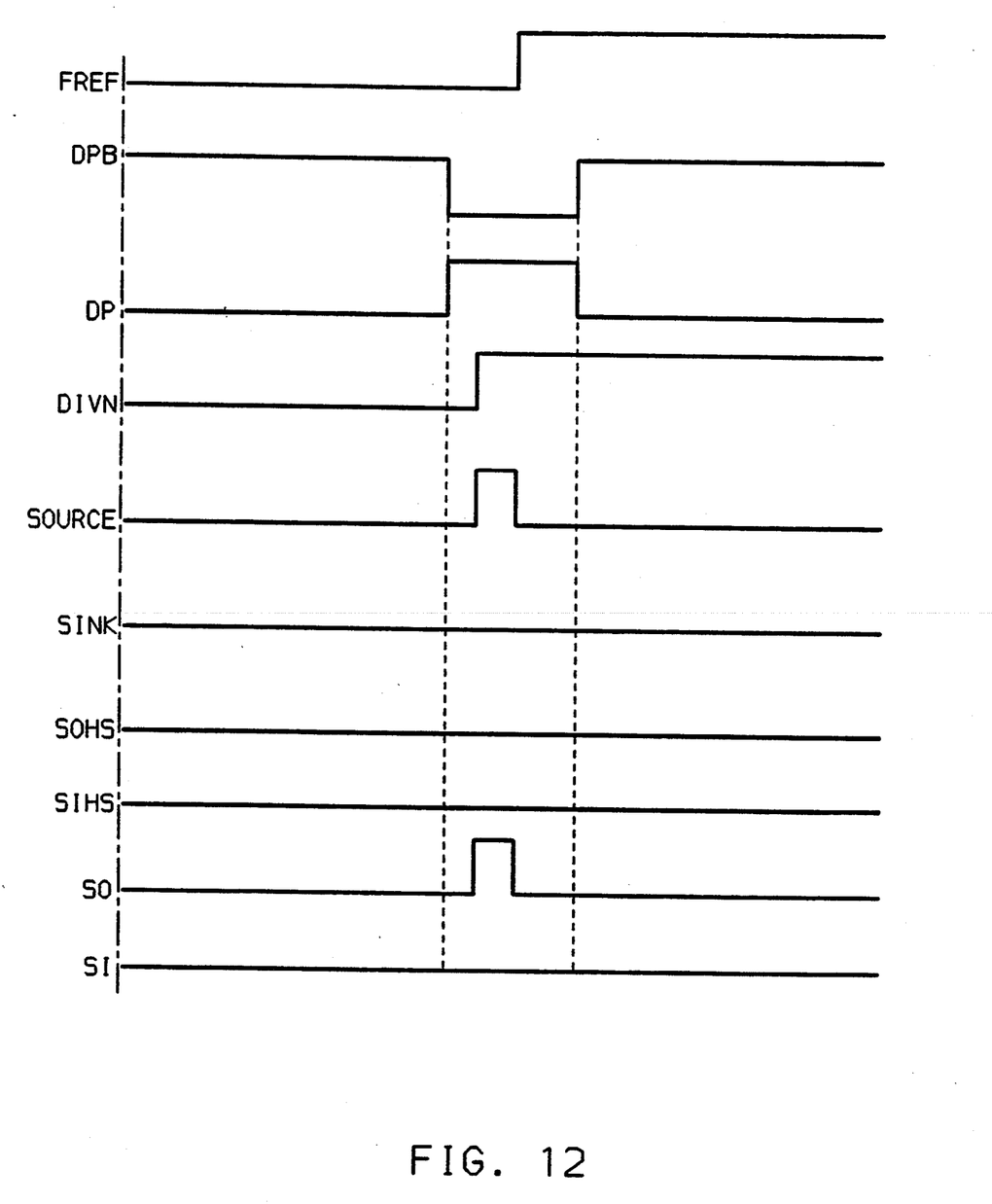

In another example mode of operation, refer to FIG. 12. The rising edge of DIVN occurs before the rising edge of FREF and inside of the DP phase window. SOURCE goes high with the rising edge of DIVN and stays high until the rising edge of FREF. SOURCE is derived in the digital section of the phase detector along with the signals DP and DPB in a manner well known to those skilled in the art. As a result, the signal SO output from AND gate 120 goes high, causing transmission gate 28 to turn on allowing current I1 to flow from the voltage supply rail through transmission gate 28 into capacitor 40, in turn causing the voltage across capacitor 40 to rise. At the rising edge of the signal FREF, SOURCE goes low, in turn bringing signal SO low via AND gate 120. Transmission gate 28 shuts off and current I1 stops flowing into capacitor 40.

During the time transmission gate 218 is on, the rate of change of voltage Vc40 is I1/C40. The overall change in voltage Vc40 on capacitor 40 is proportional to the difference in phase between the rising edge of DIVN and falling edge of SOURCE. The voltage across capacitor 40 is applied to the first and second filter stages 36 and 58.

The capacitor voltage Vc56 decreases because the voltage Vs1 is less than Vc56 and current I2 flows out of capacitor 56. This time the rate of change of the capacitor voltage Vc56 will be I2/C56 where I2 is equal to (Vs1−Vc56)/(R52+R54). The tuning voltage TV is as defined in Equation (3), which shows that TV also starts decreasing. The decrease in TV causes the voltage controlled oscillator frequency to decrease, which causes the DIVN frequency to decrease at a rate N times slower.

Figure 13:
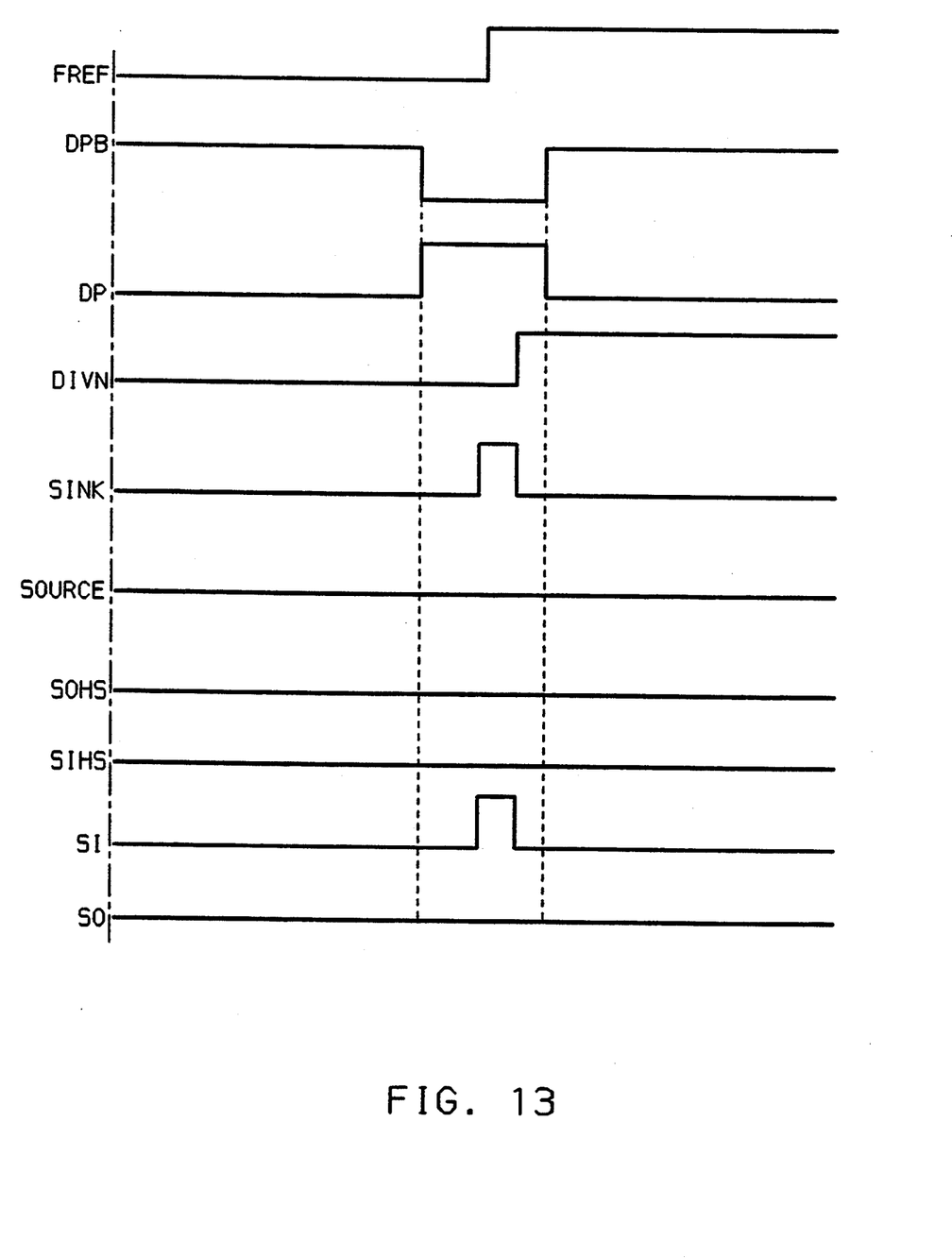

In another example mode of operation, refer to FIG. 13. The rising edge of DIVN occurs after the rising edge of FREF and inside of the DP phase window. SINK goes high with the rising edge of FREF and stays high until the rising edge of DIVN. SINK is derived in the digital section of the phase detector along with the signals DB and DPB in a manner well known to those skilled in the art. The high signals SINK and DP cause SI to go high via AND gate 122, which causes transmission gate 30 to turn on and current I1 to flow from capacitor 40 to ground via current source 34. With the current flow out of capacitor 40, the voltage across capacitor 40 drops.

With the rising edge of DIVN, the signal SINK goes low bringing SI low via AND gate 122. Transmission gate 30 then shuts off and current I1 stops flowing out of capacitor 40.

During the time transmission gate 30 is on, the rate of change of voltage Vc40 is I1/C40. The capacitor voltage Vc40 is applied to the first and second stage filters 36 and 58. The capacitor voltage Vc56 increases because the voltage Vs1 is greater than Vc56, and current I2 flows into capacitor 56. This time the rate of change of the capacitor voltage Vc56 is I2/C56 where I2 is equal to (Vs1−Vc56)/(R52+R54).

The tuning voltage TV is as defined by Equation (3), which illustrates that TV also increases. The increase in TV causes the frequency of the signal VCO to increase, which in turn causes the frequency of the signal DIVN to increase at a rate N time slower.

In summary, any of the above cases can occur on each cycle of the FREF signal. In FIGS. 10-13, there is some difference in phase between the rising edge of FREF and DIVN, indicating that the phase locked loop is in an out of lock condition. A signal that is proportional to phase difference is activated by phase detector 20′, which signal drives the voltage Vc56 on capacitor 56 in a positive or negative direction. If DIVN leads FREF, then the voltage Vc56 is driven in the positive direction. If DIVN lags FREF, then the voltage Vc56 is driven in the negative direction.

According to this invention, when the phase difference is larger than the DP window, one of the transmission gates 142 and 144 is activated. When activated, transmission gates 142 and 144, drive capacitor 56 directly with current I3, which is preferably assigned a value allowing capacitor 56 to charge and discharge at a very fast rate. The tuning voltage TV is related to the voltage Vc56 via the above expressions and moves in the same direction as Vc56. The tuning voltage TV forces the frequency of the signal VCO output from voltage controlled oscillator 62 to move in the correct direction until the frequency of voltage controlled oscillator 62 equals N times the frequency of the signal FREF. On every cycle of FREF, this correcting action occurs until the frequency and phase of the signals FREF and DIVN are equal, which is the phased locked condition.

Referring to FIG. 8, an alternative implementation of the circuitry described above that is simpler to implement on silicon is shown. Most of the circuit is identical to that shown in FIG. 7, with the exception that current sources 146 and 148 are omitted. With transmission gates 142 and 144 connected in series between the voltage supply rail (Vsup) and ground, resistor 145 acts as an inexpensive approximation to a current source.

With the improvements described herein, a frequency synthesizer for a radio can obtain lock on radio stations in time periods on the order of 5 ms or less. With the fast locking times achievable by this invention, station hopping can accomplished without a listener-perceived interruption to the radio information. This is highly advantageous in RDS systems as the selection of the best available radio station will not cause a perceivable interruption to the listener.

The above described implementations of this invention are example implementations. Moreover various improvements and modifications to this invention may occur to those skilled in the art and such improvements and modifications will fall within the scope of this invention as defined below.

The embodiments of this invention in which an exclusive property or privilege is claimed are defined as follows:

1. A phase lock loop frequency synthesizer circuit for generating a tuned frequency output signal, the synthesizer circuit comprising:
   reference oscillator means for generating a reference signal having a reference frequency;
   voltage controlled oscillator means for generating the tuned frequency output signal, wherein the tuned frequency output signal has a frequency determined by a tuning voltage applied to an input of the voltage controlled oscillator means;
   a divide by N counter for receiving the tuned frequency output signal and for generating a counter output signal having a frequency equal to that of 1/N times the received tuned frequency output signal, where N is a selectable integer determined by a counter input signal;
   phase detector means responsive to the counter output signal and the reference signal for generating phase detector output signals representative of a difference in phase between the counter output signal and the reference signal;
   first circuit means responsive to the phase detector output signals for charging and discharging a first capacitor to develop a first capacitor voltage thereacross which is proportional to the difference in phase between the counter output signal and the reference signal when the phase difference is less than a non-zero predetermined phase value;
   loop filter means coupled to the first capacitor for filtering the first capacitor voltage to produce the tuning voltage for the voltage controlled oscillator means at a filter output, the loop filter means including a second capacitor coupled to the filter output, the second capacitor defining a limiting rate at which the tuning voltage can be changed in response to a change in the first capacitor voltage; and
   second circuit means responsive to the phase detector output signals for charging and discharging the second capacitor based upon the difference in phase between the counter output signal and the reference signal, when the phase difference exceeds the non-zero predetermined phase value, to change the tuning voltage in response to changes in the phase difference at a rate greater than the limiting rate.

2. A phase lock loop frequency synthesizer circuit for generating a tuned frequency output signal, the synthesizer circuit comprising:
   an oscillator for generating a reference signal at a reference frequency;
   a voltage controlled oscillator for generating the tuned frequency output signal, wherein the tuned frequency output signal has a frequency determined by a tuning voltage applied to an input of the voltage controlled oscillator;
   a divide by N counter for receiving the tuned frequency output signal and for generating a counter output signal having a frequency equal to that of 1/N times the received tuned frequency output signal, where N is a selectable integer determined by a counter input signal;
   phase detector means responsive to the counter output signal and the reference signal for generating phase detector output signals representative of a difference in phase between the counter output signal and the reference signal;
   first circuit means responsive to the phase detector output signals for charging and discharging a first capacitor to develop a first capacitor voltage thereacross which is proportional to the difference in phase between the counter output signal and the reference signal when the phase difference is less than a non-zero predetermined phase value;
   a first filter stage coupled to the first capacitor and including a switched capacitor network operating to integrate the first capacitor voltage to produce a first filter output voltage;
   a second filter stage coupled to the first filter stage for receiving and filtering the first filter output voltage to produce the tuning voltage at a second filter output, the second filter stage comprising a lead-lag network including a second capacitor coupled to the second filter output, the second capacitor defining a limiting rate at which the tuning voltage can be changed in response to a change in the first capacitor voltage; and
   second circuit means responsive to the phase detector output signals for charging and discharging the second capacitor based upon the difference in phase between the counter output signal and the reference signal, when the phase difference exceeds the non-zero predetermined phase value, to change the tuning voltage in response to changes in the phase difference at a rate greater than the limiting rate.

3. The phase lock loop frequency synthesizer of claim 2, wherein the second circuit means includes:
   first and second transmission gates connected in series at a first node and coupled between a voltage supply and a ground;
   a resistor connected between the first node and the second capacitor;
   gate control means responsive to the phase detector output signals for selectively operating the first and second transmission gates to provide current flow through the resistor to charge and discharge the second capacitor based upon the phase difference between the counter output signal and the reference signal when the phase difference exceeds the non-zero predetermined phase value.

* * * * *